US012796182B2

(12) United States Patent
Yun et al.

(10) Patent No.: US 12,796,182 B2
(45) Date of Patent: Nov. 10, 2026

(54) LIGHT EMITTING DIODE MODULE

(71) Applicant: SAMSUNG ELECTRONICS CO., LTD., Suwon-si (KR)

(72) Inventors: Kwangseok Yun, Suwon-si (KR); Sunki Kim, Suwon-si (KR); Geunho Lim, Seoul (KR); Hyungchan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 808 days.

(21) Appl. No.: 18/092,480

(22) Filed: Jan. 3, 2023

(65) Prior Publication Data

US 2023/0231083 A1 Jul. 20, 2023

(30) Foreign Application Priority Data

Jan. 19, 2022 (KR) ........................ 10-2022-0007797

(51) Int. Cl.

*H10W 90/00* (2026.01)
*H10H 20/814* (2025.01)
(Continued)

(52) U.S. Cl.

CPC ...... *H10H 20/8506* (2025.01); *H10H 20/814* (2025.01); *H10H 20/857* (2025.01); *H10H 20/8582* (2025.01); *H10W 90/00* (2026.01)

(58) Field of Classification Search

CPC ............. H10H 20/8506; H10H 20/814; H10H 20/857; H10H 20/8582; H10H 20/8583;
(Continued)

(56) References Cited

U.S. PATENT DOCUMENTS 3,331,996 A * 7/1967 Green .................. H01L 25/167 257/772
6,372,608 B1 4/2002 Shimoda et al.
(Continued)

FOREIGN PATENT DOCUMENTS

DE 102015107864 A1 11/2015
JP 2008-277349 A 11/2008
(Continued)

OTHER PUBLICATIONS

Office Action dated Oct. 28, 2024 for corresponding application No. DE 102023100486.7.

*Primary Examiner* — Monica D Harrison
(74) *Attorney, Agent, or Firm* — Muir Patent Law, PLLC

(57) ABSTRACT

A LED module includes a support including a heat dissipation pad; a circuit board on the support and including contact pads and an electrical connection terminal electrically connected to the contact pads; an LED device including a wiring board having lower and upper surfaces, a lower wiring on the lower surface and facing the heat dissipation pad, an upper wiring on the upper surface and electrically insulated from the lower wiring, contact structures at one side of the upper wiring, an LED chip mounted on another side of the upper wiring, a wavelength conversion film on the LED chip, and a reflective structure covering the upper surface such that a portion of the contact structures and the wavelength conversion film is exposed; a bonding wire electrically connecting the contact pads and the contact structures; and a conductive bump between the heat dissipation pad and the lower wiring.

20 Claims, 17 Drawing Sheets

(51) Int. Cl.
*H10H 20/85* (2025.01)
*H10H 20/857* (2025.01)
*H10H 20/858* (2025.01)

(58) Field of Classification Search
CPC .... H10H 20/851; H10H 29/857; H10H 29/24; H10H 29/8506; H10H 29/851; H10H 29/8583; H10H 29/942; H01L 25/0753; H01L 25/167; H05K 1/117; H05K 1/14; H05K 2203/049; H10W 90/00
USPC ........................................................ 257/79
See application file for complete search history.

(56) References Cited

U.S. PATENT DOCUMENTS

| | | | | |
|---|---|---|---|---|
| 6,378,199 | B1 * | 4/2002 | Yoshinuma ............ | H05K 3/225 174/262 |
| 6,645,830 | B2 | 11/2003 | Shimoda et al. | |
| RE38,466 | E | 3/2004 | Inoue et al. | |
| 6,818,465 | B2 | 11/2004 | Biwa et al. | |
| 6,818,530 | B2 | 11/2004 | Shimoda et al. | |
| 6,858,081 | B2 | 2/2005 | Biwa et al. | |
| 6,967,353 | B2 | 11/2005 | Suzuki et al. | |
| 7,002,182 | B2 | 2/2006 | Okuyama et al. | |
| 7,084,420 | B2 | 8/2006 | Kim et al. | |
| 7,087,932 | B2 | 8/2006 | Okuyama et al. | |
| 7,154,124 | B2 | 12/2006 | Han et al. | |
| 7,208,725 | B2 | 4/2007 | Sherrer et al. | |
| 7,288,758 | B2 | 10/2007 | Sherrer et al. | |
| 7,319,044 | B2 | 1/2008 | Han et al. | |
| 7,501,656 | B2 | 3/2009 | Han et al. | |
| 7,709,857 | B2 | 5/2010 | Kim et al. | |
| 7,759,140 | B2 | 7/2010 | Lee et al. | |
| 7,781,727 | B2 | 8/2010 | Sherrer et al. | |
| 7,786,492 | B2 | 8/2010 | Omae et al. | |
| 7,790,482 | B2 | 9/2010 | Han et al. | |
| 7,894,203 | B2 * | 2/2011 | Kariya .............. | H01L 23/49838 361/795 |
| 7,940,350 | B2 | 5/2011 | Jeong | |
| 7,959,312 | B2 | 6/2011 | Yoo et al. | |
| 7,964,881 | B2 | 6/2011 | Choi et al. | |
| 7,985,976 | B2 | 7/2011 | Choi et al. | |
| 7,994,525 | B2 | 8/2011 | Lee et al. | |
| 8,008,683 | B2 | 8/2011 | Choi et al. | |
| 8,013,352 | B2 | 9/2011 | Lee et al. | |
| 8,049,161 | B2 | 11/2011 | Sherrer et al. | |
| 8,113,688 | B2 | 2/2012 | Marchl et al. | |
| 8,129,711 | B2 | 3/2012 | Kang et al. | |
| 8,179,938 | B2 | 5/2012 | Kim | |
| 8,263,987 | B2 | 9/2012 | Choi et al. | |
| 8,324,646 | B2 | 12/2012 | Lee et al. | |
| 8,389,306 | B2 * | 3/2013 | Yu ........................ | H10H 20/853 257/711 |
| 8,399,944 | B2 | 3/2013 | Kwak et al. | |
| 8,432,511 | B2 | 4/2013 | Jeong | |
| 8,459,832 | B2 | 6/2013 | Kim | |
| 8,476,645 | B2 | 7/2013 | McDaniel et al. | |
| 8,502,242 | B2 | 8/2013 | Kim | |
| 8,536,604 | B2 | 9/2013 | Kwak et al. | |
| 8,735,931 | B2 | 5/2014 | Han et al. | |
| 8,766,295 | B2 | 7/2014 | Kim | |
| 9,070,851 | B2 * | 6/2015 | Seo ...................... | H10H 20/833 |
| 9,190,394 | B2 | 11/2015 | Singer et al. | |
| 9,269,594 | B2 | 2/2016 | Mohammed et al. | |
| 10,064,272 | B2 | 8/2018 | Lee et al. | |
| 10,548,213 | B2 * | 1/2020 | Nagashima .......... | H05K 1/0298 |
| 11,215,334 | B2 * | 1/2022 | Droegeler ............... | F21S 45/48 |
| 2004/0212965 | A1 * | 10/2004 | Ishii .................. | H01L 23/49531 257/E23.098 |
| 2006/0180818 | A1 | 8/2006 | Nagai et al. | |
| 2012/0074441 | A1 | 3/2012 | Seo et al. | |
| 2015/0333241 | A1 * | 11/2015 | Chen .................... | H10H 20/857 257/93 |
| 2016/0298818 | A1 | 10/2016 | Duarte et al. | |
| 2018/0086249 | A1 | 3/2018 | Dorn et al. | |

FOREIGN PATENT DOCUMENTS

| | | | |
|---|---|---|---|
| KR | 10-2012-0031342 | A | 4/2012 |
| KR | 10-2014-0004726 | A | 1/2014 |
| KR | 10-2021-0114943 | A | 9/2021 |

* cited by examiner

LIGHT EMITTING DIODE MODULE

CROSS-REFERENCE TO RELATED APPLICATION

This application claims benefit of priority to Korean Patent Application No. 10-2022-0007797 filed on Jan. 19, 2022, in the Korean Intellectual Property Office, the disclosure of which is incorporated herein by reference in its entirety.

BACKGROUND

1. Field

Embodiments relate to a light emitting diode (LED) module.

2. Description of the Related Art

In order to maintain the reliability and performance of LED modules, a heat dissipation structure for efficiently dissipating heat generated by LED devices may be used.

SUMMARY

The embodiments may be realized by providing a light emitting diode (LED) module including a support including a heat dissipation pad; a circuit board spaced apart from the heat dissipation pad on the support, the circuit board including at least one pair of contact pads and an electrical connection terminal electrically connected to the at least one pair of contact pads; an LED device including a wiring board having a lower surface and an upper surface opposing each other, a lower wiring on the lower surface of the wiring board and facing the heat dissipation pad, an upper wiring on the upper surface of the wiring board and electrically insulated from the lower wiring, at least one pair of contact structures at one side of the upper wiring, at least one LED chip mounted on another side of the upper wiring, at least one wavelength conversion film on the at least one LED chip, and a reflective structure covering the upper surface of the wiring board such that at least a portion of each of the at least one pair of contact structures and the at least one wavelength conversion film is exposed; a bonding wire electrically connecting the at least one pair of contact pads and the at least one pair of contact structures to each other; and a conductive bump between the heat dissipation pad and the lower wiring.

The embodiments may be realized by providing a light emitting diode (LED) module including a support including a heat dissipation pad; a circuit board spaced apart from the heat dissipation pad on the support and including a pair of contact pads; an LED device including a wiring board having a lower surface and an upper surface opposing each other, a lower wiring on the lower surface of the wiring board and facing the heat dissipation pad, an upper wiring on the upper surface of the wiring board, a pair of contact structures on the upper wiring, a plurality of LED chips electrically connected to the pair of contact structures through the upper wiring, and a reflective structure covering the upper surface of the wiring board such that at least a portion of the pair of contact structures is exposed; a bonding wire electrically connecting the pair of contact pads and the pair of contact structures to each other; and a conductive bump between the heat dissipation pad and the lower wiring.

The embodiments may be realized by providing a light emitting diode (LED) module including a support including a heat dissipation pad; a circuit board spaced apart from the heat dissipation pad on the support and including a pair of contact pads; an LED device including a wiring board having a lower surface and an upper surface opposing each other, a lower wiring on the lower surface of the wiring board and facing the heat dissipation pad, an upper wiring on the upper surface of the wiring board, a pair of contact structures on the upper wiring, a plurality of LED chips electrically connected to the pair of contact structures through the upper wiring, and a reflective structure covering the upper surface of the wiring board such that at least a portion of the pair of contact structures is exposed; a bonding wire electrically connecting the pair of contact pads and the pair of contact structures to each other; and a conductive bump between the heat dissipation pad and the lower wiring, wherein the heat dissipation pad completely overlaps the LED device in a plan view.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
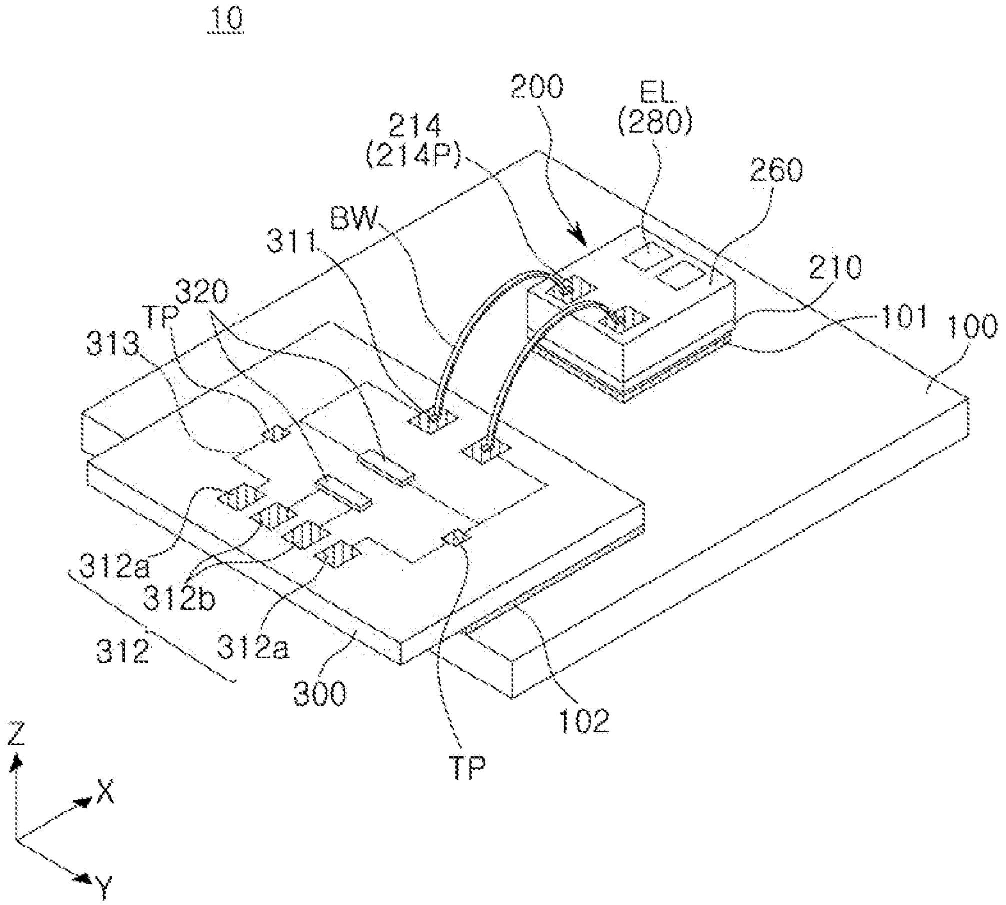
FIG. 1A is a perspective view of a light emitting diode (LED) module according to an embodiment.
Figure 1B:
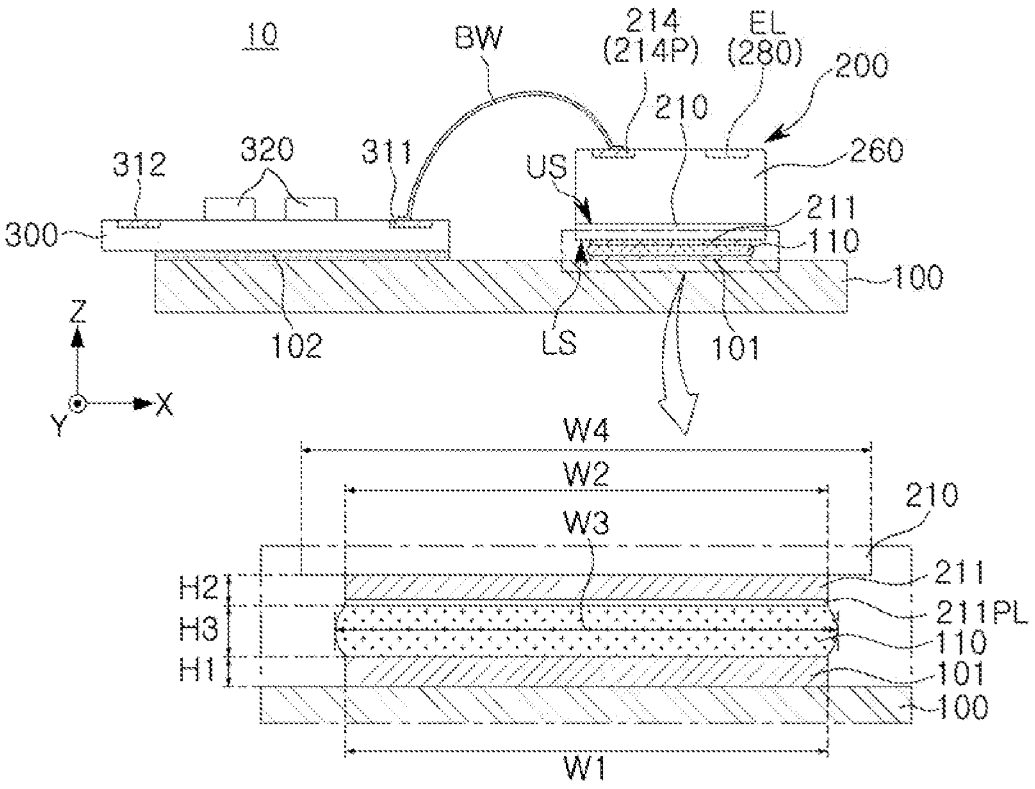
FIG. 1B is a side view of a right side of the LED module of FIG. 1A.

FIG. 1A is a perspective view of an LED module 10 according to an embodiment, and FIG. 1B is a side view of a right side of the LED module of FIG. 1A.

Referring to FIGS. 1A and 1B, the LED module 10 according to an embodiment may include a support 100, an LED device 200, and a circuit board 300. In an implementation, the LED device 200 may be attached to the support 100 using a metal structure (e.g., a metal pad or a metal bump) instead of an adhesive resin, thereby improving heat dissipation efficiency through the support 100 and removing a residue protruding to the outside of the LED device 200 to impair the aesthetics (e.g., an adhesive resin may leak out of the LED device 200). In an implementation, misalignment of the LED device 200 (which could otherwise occur during a curing time of the adhesive resin) may be prevented, and a distance between the LED device 200 and the support 100 may be uniform. In an implementation, design accuracy may be improved and characteristic deviation of the LED module 10 resulting from a design error or a process error (e.g., a difference in height from the support 100 to a light emitting region EL of the LED device 200) may be minimized. In an implementation, this structure may also be applied to a device for fixing an electronic component (e.g., an integrated circuit chip, a transistor chip, or the like) to a separate support (e.g., a substrate, a heat sink, or the like) using an adhesive resin.

The support 100 may be a support structure on which the LED device 200 and the circuit board 300 are mounted, and may include elements for the LED module 10 to be coupled to a lighting device (e.g., a head lamp). In an implementation, the support 100 may include a material having high thermal conductivity, e.g., copper (Cu), aluminum (Al), iron (Fe), nickel (Ni), silver (Ag), gold (Au), platinum (Pt), tin (Sn), lead (Pb), titanium (Ti), chromium (Cr), palladium (Pd), indium (In), zinc (Zn), carbon (C), or alloys thereof. The support 100 may include a heat dissipation pad 101 on which the LED device 200 may be mounted. In an implementation, by attaching the LED device 200 on the heat dissipation pad 101 using a surface mount technology (SMT), a heat dissipation path connected from the LED device 200 to the support 100 may be formed. The heat dissipation pad 101 may include a material having a thermal conductivity of about 300 K/mK or more. In an implementation, the heat dissipation pad 101 may include, e.g., aluminum (Al), gold (Au), cobalt (Co), copper (Cu), nickel (Ni), lead (Pb), tantalum (Ta), and tellurium (Te), titanium (Ti), tungsten (W), or alloys thereof. In an implementation, the heat dissipation pad 101 may further include a surface plating layer in contact with a conductive bump 110 (refer to the embodiments of FIGS. 3 and 4).

In an implementation, on a plane (X-Y plane), the heat dissipation pad 101 may have a planar area smaller than that of the LED device 200 (or a wiring board 210), thereby completely overlapping the LED device 200 and limiting a spread region of the conductive bump 110. In an implementation, during a reflow process, the conductive bump 110 may not protrude to the outside of the LED device 200. In an implementation, the heat dissipation pad 101 may have a width W1 smaller than a width W4 of the wiring board 210 in a direction parallel to a lower surface LS of the wiring board 210 (e.g., the X direction).

In an implementation, the characteristics of the LED module 10 may be maintained to be constant by forming a height H1 (e.g., in a vertical Z direction) from an upper surface of the support 100 to the upper surface of the heat dissipation pad 101 according to a design. In an implementation, the height H1 from the upper surface of the support 100 to the upper surface of the heat dissipation pad 101 may be, e.g., in the range of about 1 μm to about 30 μm, about 1 μm to about 20 μm, about 5 μm to about 30 μm, about 5 μm to about 20 μm, about 10 μm to about 30 μm, or about 10 μm to about 20 μm. In an implementation, the height H1 of the heat dissipation pad 101 may be variously changed according to a design.

The LED device 200 may be on the heat dissipation pad 101 of the support 100, and may include the wiring board 210 and a reflective structure 260.

The wiring board 210 may have a lower surface LS and an upper surface US opposing each other. At least one LED chip and a wavelength conversion film 280 may be sequentially stacked on the upper surface US of the wiring board 210, and at least a pair of contact structures 214 may be spaced apart therefrom on the upper surface US of the wiring board 210. The pair of contact structures 214 may be electrically connected to an LED chip through an upper wiring (refer to 212 of FIG. 5A) of the wiring board 210. The wiring board 210 may be, e.g., a printed circuit board (PCB) such as a metal core PCB (MCPCB), a metal PCB (MPCB), a flexible PCB (FPCB), or the like, or a ceramic board.

A lower wiring 211 may be on the lower surface LS of the wiring board 210. The lower wiring 211 may be for surface mounting of the LED device 200 and may be electrically insulated from the LED chip. The lower wiring 211 may have a width W2 smaller than the width W4 of the wiring board 210 in the direction (e.g., the X-axis direction), parallel to the lower surface LS of the wiring board 210. In an implementation, the width W2 of the lower wiring 211 may be substantially the same as the width W1 of the heat dissipation pad 101. In an implementation, the lower wiring 211 may include a first surface plating layer 211PL in contact with the conductive bump 110. The lower wiring 211 may include, e.g., aluminum (Al), gold (Au), cobalt (Co), copper (Cu), nickel (Ni), lead (Pb), tantalum (Ta), tellurium (Te), titanium (Ti), or alloys thereof. The first surface plating layer 211PL may include, e.g., tin (Sn), lead (Pb), nickel (Ni), or gold (Au). In an implementation, the height H2 of the lower wiring 211 may be similar to the height H1 of the heat dissipation pad 101 (e.g., as measured in the Z direction). The height H2 of the lower wiring 211 may be variously modified according to a design. Components constituting the wiring board 210 will be described in more detail with reference to FIGS. 6A to 6C. As used herein, the terms "first," "second," and the like are merely for identification and differentiation, and are not intended to imply or require sequential inclusion (e.g., a third element and a fourth element may be described without implying or requiring the presence of a first element or second element).

In an implementation, the LED device 200 may be surface-mounted on the support 100 using the lower wiring 211 and the conductive bump 110 instead of an adhesive resin, so that a residue (e.g., an adhesive resin leaking out of the LED device 200) may be prevented from protruding to the outside of the LED device 200. In an implementation, on a plane (X-Y plane), the wiring board 210 may overlap the entirety of the heat dissipation pad 101. The conductive bump 110 may be between the heat dissipation pad 101 and the lower wiring 211 and may be formed so as not to protrude from or beyond an edge of the wiring board 210 on a plane (X-Y plane). In an implementation, the conductive bump 110 may have a width W3 equal to or smaller than the width W4 of the wiring board 210 in the direction (e.g., the X direction) parallel to the lower surface LS of the wiring board 210. In an implementation, the conductive bump 110 may include a material having a thermal conductivity of about 10 K/mK or more. In an implementation, the conductive bump 110 may include tin (Sn), indium (In), bismuth (Bi), antimony (Sb), copper (Cu), silver (Ag), zinc (Zn), lead (Pb), or alloys thereof. In an implementation, the conductive bump 110 may help improve the heat dissipation effect between the LED device 200 and the support 100. A height H3 of the conductive bump 110 (in the Z direction) may be, e.g., in a range of about 1 μm to about 50 μm, about 1 μm to about 40 μm, about 1 μm to about 30 μm, or about 1 μm to about 20 μm. In an implementation, the height H3 of the conductive bump 110 may be variously changed according to a design.

The reflective structure 260 may cover the upper surface US of the wiring board such that at least a portion of each of the at least one wavelength conversion film 280 stacked on at least one LED chip and at least one pair of contact structures 214 may be thereon. The reflective structure 260 may define the light emitting region EL provided by the at least one wavelength conversion film 280. The reflective structure 260 may include a resin body containing reflective powder. In an implementation, the resin body may include silicone or an epoxy resin. The reflective powder may be a white ceramic powder or a metal powder. In an implementation, the ceramic powder may include, e.g., $TiO_2$, $Al_2O_3$, $Nb_2O_5$, or ZnO. The metal powder may include, e.g., Al or Ag.

The circuit board 300 may be on the support 100 and spaced apart from the heat dissipation pad 101, and may include at least one pair of contact pads 311, an electrical connection terminal 312, and a wiring circuit 313. The circuit board 300 may be fixed on the support 100 by an adhesive layer 102. The pair of contact pads 311 may be electrically connected to the pair of contact structures 214 by a bonding wire BW, respectively. The pair of contact pads 311 may include, e.g., aluminum (Al), gold (Au), cobalt (Co), copper (Cu), nickel (Ni), lead (Pb), tantalum (Ta), tellurium (Te), titanium (Ti), or alloys thereof. The electrical connection terminal 312 may be electrically connected to the at least one pair of contact pads 311 through the wiring circuit 313. A number of electrical connection terminals 312 may be equal to or greater than a number of the pair of contact pads 311. In an implementation, the electrical connection terminal 312 may include second electrical connection terminals 312*b* for passive elements 320, in addition to a pair of first electrical connection terminals 312*a* for input/output signal transmission of the LED device 200 to correspond to the pair of contact pads 311. The wiring circuit 313 may electrically connect the passive elements 320, the electrical connection terminal 312, and at least one pair of contact pads 311. The circuit board 300 may be a support board on which the passive elements 320 are mounted, and may include a PCB, a ceramic board, a glass board, a tape wiring board, or the like. The passive elements 320 may include a capacitor element, a resistor element, or an inductor element. The passive elements 320 may constitute a driving circuit of the LED device 200 together with the wiring circuit 313. In an implementation, a test terminal TP for electrical testing of the driving circuit may be between the pair of first electrical connection terminals 312*a* and the pair of contact pads 311 respectively connected through the wiring circuit 313.

Figure 2:
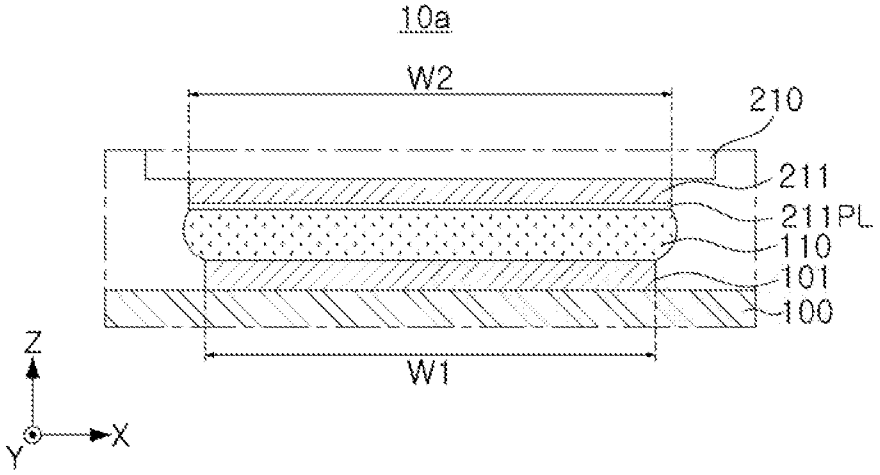
FIG. 2 is a partially enlarged view of a modified example of an LED module according to an embodiment.

FIG. 2 is a partially enlarged view of a modified example of an LED module 10*a* according to an embodiment.

Referring to FIG. 2, the LED module 10*a* of the modified example has the same or similar characteristics as those described above with reference to FIGS. 1A and 1B, except that the planar area of the heat dissipation pad 101 may be smaller than that of the lower wiring 211. In an implementation, the lower wiring 211 may have a width W2 greater than a width W1 of the heat dissipation pad 101 in the direction (e.g., X direction) parallel to the lower surface LS of the wiring board 210. In an implementation, the heat dissipation pad 101 may completely overlap the wiring board 210 in the vertical direction (Z direction). In an implementation, a wet region and spread region of the conductive bump 110 may be limited to the inside of the wiring board 210 so that the conductive bump 110 may not protrude to the outside of or beyond the wiring board 210 on a plane (X-Y plane).

Figure 3:
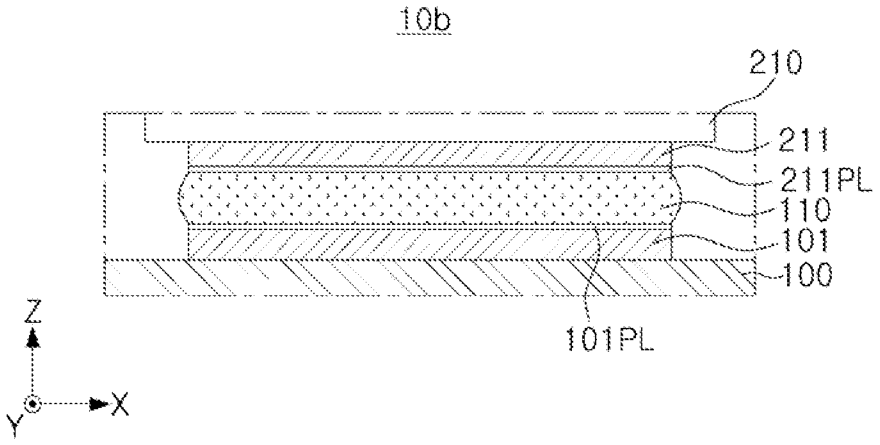
FIG. 3 is a partially enlarged view of a modified example of an LED module according to an embodiment.

FIG. 3 is a partially enlarged view of a modified example of an LED module 10*b* according to an embodiment.

Referring to FIG. 3, the LED module 10*b* of the modified example has the same or similar characteristics as those described above with reference to FIGS. 1A to 2, except that the heat dissipation pad 101 may include a second surface plating layer 101PL in contact with the conductive bump 110. In this modified example, the lower wiring 211 may include the first surface plating layer 211PL in contact (e.g., direct contact) with the conductive bump 110, and the heat dissipation pad 101 may include the second surface plating layer 101PL in contact (e.g., direct contact) with the conductive bump 110. The second surface plating layer 101PL may include a material that is the same as or similar to that of the first surface plating layer 211PL, e.g., tin (Sn), lead (Pb), nickel (Ni), or gold (Au). The second surface plating layer 101PL may be a metal film of a single-layer or multilayer providing an upper surface of the heat dissipation pad 101. The second surface plating layer 101PL may limit a wet region of the conductive bump 110 to the upper surface of the heat dissipation pad 101, and may help improve connection reliability between the heat dissipation pad 101 and the conductive bump 110.

Figure 4:
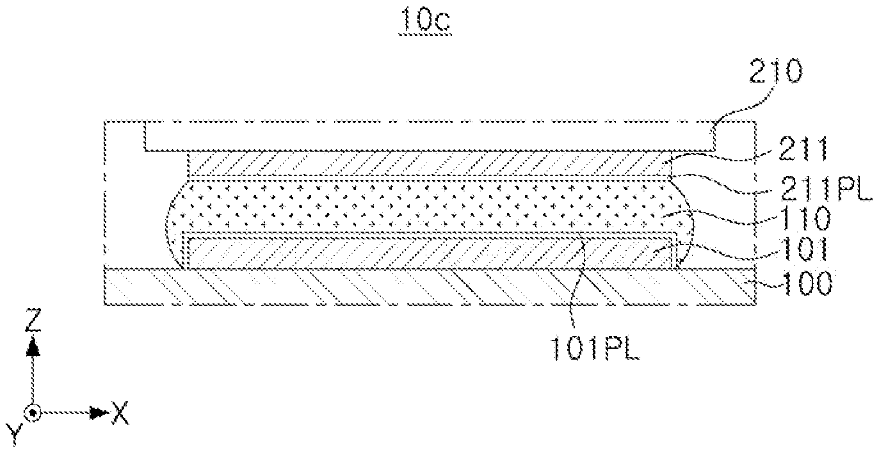
FIG. 4 is a partially enlarged view of a modified example of an LED module according to an embodiment.

FIG. 4 is a partially enlarged view of a modified example of a LED module 10*c* according to an embodiment.

Referring to FIG. 4, the LED module 10*c* of the modified example has the same or similar characteristics as those described above with reference to FIGS. 1A to 2, except that the LED module 10*c* may include the second surface plating layer 101PL forming an upper surface and a side surface of the heat dissipation pad 101. In this modified example, the lower wiring 211 may include the first surface plating layer 211PL in contact (e.g., direct contact) with the conductive bump 110, and the heat dissipation pad 101 may include the second surface plating layer 101PL in contact (e.g., direct contact) with the conductive bump 110. The second surface plating layer 101PL may be a metal film of a single-layer or multilayer providing the upper and side surfaces of the heat dissipation pad 101. The second surface plating layer 101PL may extend a wet region of the conductive bump 110 to the side surface of the heat dissipation pad 101, thereby improving the connection reliability between the heat dissipation pad 101 and the conductive bump 110 and further increasing the heat dissipation effect.

Figure 5A:
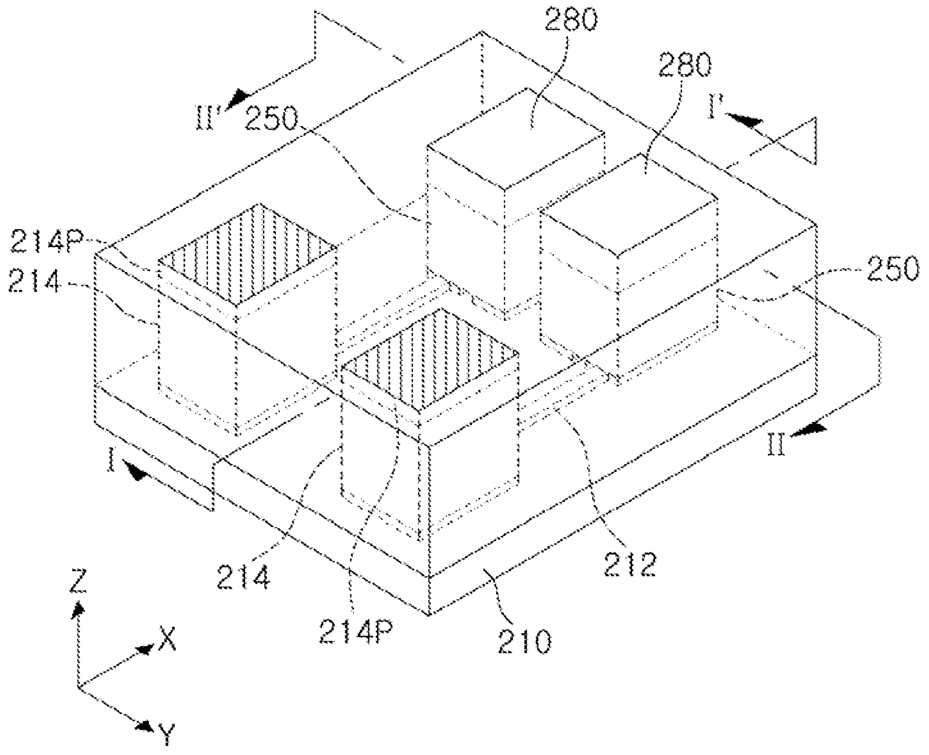
FIG. 5A is a perspective view of an LED device applicable to an LED module.
Figure 5B:
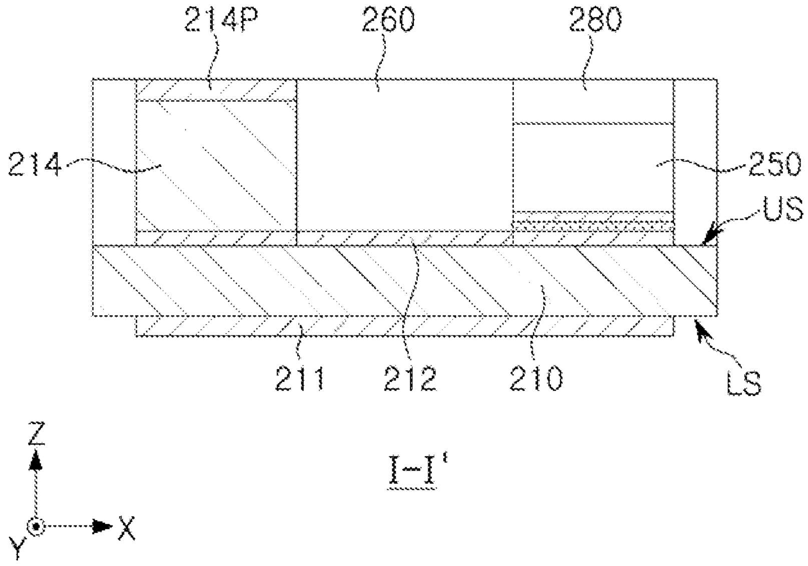
FIG. 5B is a cross-sectional view taken along line I-I' of FIG. 5A.
Figure 5C:
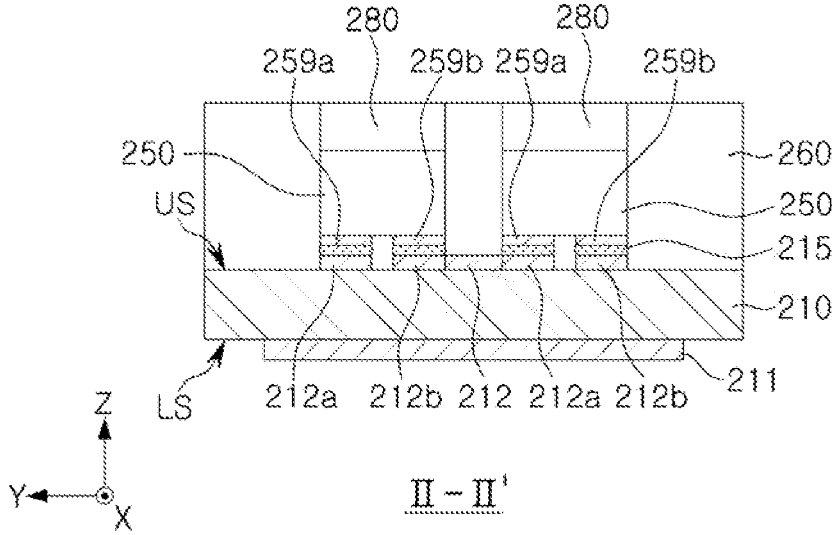
FIG. 5C is a cross-sectional view taken along line II-II' of FIG. 5A.

FIG. 5A is a perspective view of an LED device 200 applicable to an LED module, FIG. 5B is a cross-sectional view taken along line I-I' of FIG. 5A, and FIG. 5C is a cross-sectional view taken along line II-II' of FIG. 5A.

Referring to FIGS. 5A to 5B, the LED device 200 may include the wiring board 210, the LED chip 250, the wavelength conversion film 280, and the reflective structure 260.

The wiring board 210 may include the lower wiring 211 on the lower surface LS thereof, an upper wiring 212 on the upper surface US thereof, and at least one pair of the contact structures 214 on one side of the upper wiring 212. At least one LED chip 250 may be mounted on the other side of the upper wiring 212. The wiring board 210 may be a package substrate such as a PCB, a ceramic substrate, a glass substrate, or a tape wiring board.

The upper wiring 212 may include, e.g., aluminum (Al), gold (Au), cobalt (Co), copper (Cu), nickel (Ni), lead (Pb), tantalum (Ta), tellurium (Te), titanium (Ti), or alloys thereof. The upper wiring 212 may be electrically insulated from the lower wiring 211, and may electrically connect at least one LED chip 250 and at least one pair of contact structures 214.

The at least one pair of contact structures 214 may be electrically connected to the at least one LED chip 250 through the upper wiring 212, and may be exposed to the outside of the LED device 200 to provide an input/output terminal of a current for driving the LED chip 250. In an implementation, each of the at least one pair of contact structures 214 may include a metal pad portion 214P exposed at the upper surface of the LED device 200. The at least one pair of contact structures 214 and the metal pad portion 214P may be formed of a metal material, e.g., aluminum (Al), tungsten (W), or molybdenum (Mo), or a semiconductor material, e.g., doped polysilicon.

The at least one LED chip 250 may be surface mounted on the upper surface US of the wiring board 210, and may be electrically connected to the at least one pair of contact structures 214 through the upper wiring 212. In an implementation, the at least one LED chip 250 may be electrically connected to wiring electrodes 212*a* and 212*b* of the upper wiring 212 through the metal bump 215. The metal bump 215 may include, e.g., tin (Sn), lead (Pb), nickel (Ni), or gold (Au). The at least one LED chip 250 may be provided as a plurality of LED chips 250 each having a first electrode 259*a* and a second electrode 259*b*. In an implementation, the plurality of LED chips 250 may be connected to each other in series through the upper wiring 212 so that current may flow in a forward direction through each of the first and second electrodes 259*a* and 259*b*. In an implementation, the plurality of LED chips 250 may be connected in parallel.

At least one wavelength conversion film 280 may be stacked on each LED chip 250 to correspond to the at least one LED chip 250. The at least one wavelength conversion film 280 may include at least one wavelength conversion material converting a portion of light emitted from the LED chip 250 into light of a first wavelength different from an emission wavelength. The wavelength conversion film 280 may be, e.g., a resin layer in which a wavelength conversion material is dispersed or a ceramic phosphor film. The wavelength conversion material may be a phosphor or a quantum dot. In an implementation, the LED device 200 may be configured to emit white light. The LED chip 250 may emit blue light, and the wavelength conversion material may include a phosphor or quantum dot converting a portion of blue light into yellow light, or may include a plurality of phosphors or quantum dots converting a portion of blue light into red and green light.

The reflective structure 260 may cover the upper surface US of the wiring board 210 such that at least a portion of each of the at least one pair of contact structures 214 and the at least one wavelength conversion film 280 is exposed. The reflective structure 260 may include a resin body containing reflective powder. An upper surface of the reflective structure 260 may be coplanar with the upper surface of the at least one pair of contact structures 214 and the upper surface of the at least one wavelength conversion film 280.

Figure 6A:
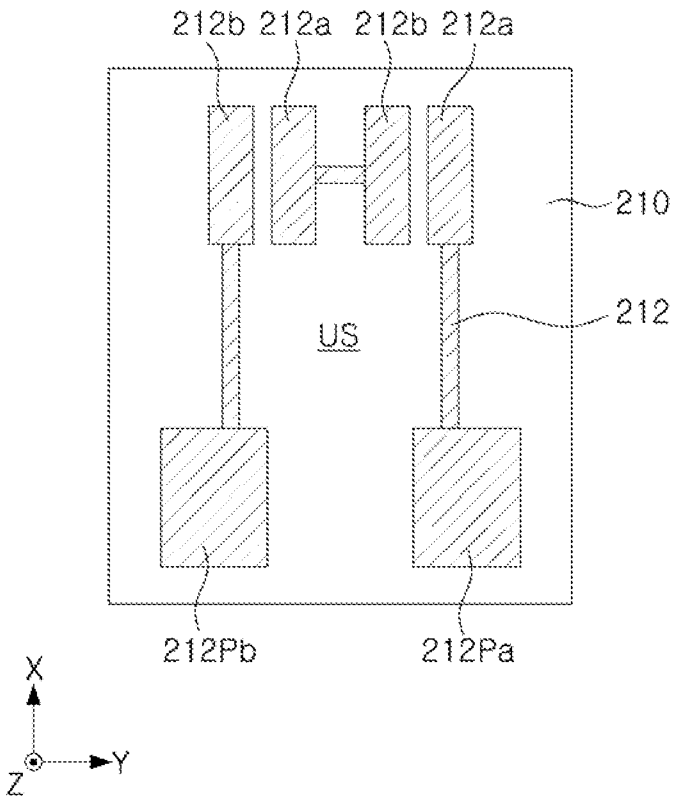
FIG. 6A is a plan view of an upper surface of a wiring board applicable to an LED device.
Figure 6B:
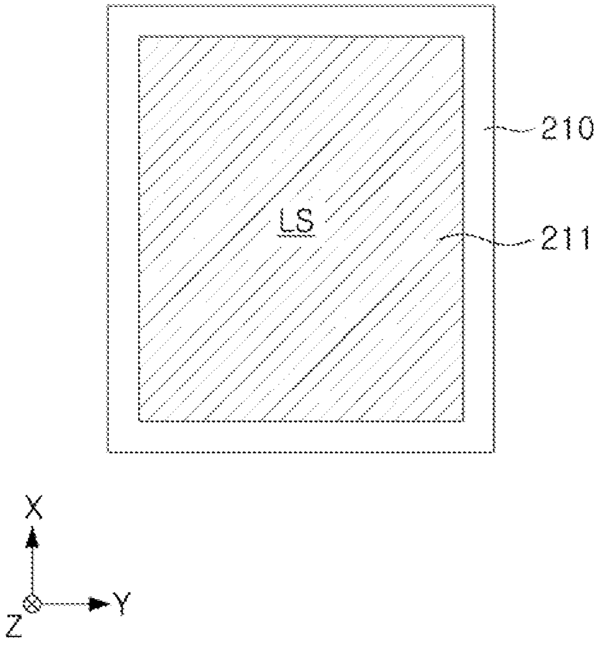
FIG. 6B is a bottom view of a lower surface of a wiring board applicable to an LED device.

FIG. 6A is a plan view of an upper surface US of the wiring board 210 applicable to an LED device, and FIG. 6B is a bottom view of a lower surface LS of the wiring board 210 applicable to an LED device.

Referring to FIGS. 6A and 6B, the wiring board 210 may have the upper surface US on which an upper wiring 212 is disposed and the lower surface LS on which a lower wiring 211 is disposed.

The upper wiring 212 may include first and second wiring electrodes 212*a* and 212*b* corresponding to the first and second electrodes 259*a* and 259*b* of an LED chip (‘250’ of FIG. 5C), respectively, and at least one pair of landing electrodes 212Pa and 212Pb corresponding to the at least one pair of contact structures (‘214’ of FIG. 5A). In the upper wiring 212, at least a pair of landing electrodes 212Pa and 212Pb may intersect to be connected to the first and second electrodes 259*a* and 259*b* of each of the LED chips (‘250’ of FIG. 5C) to supply a forward current to the at least one LED chip (‘250’ of FIG. 5C).

The lower wiring 211 may be electrically insulated from the upper wiring 212 and may be connected to the heat dissipation pad 101 of the support (‘100’ of FIG. 1A) to provide a path for dissipating heat generated by the LED chip 250. In an implementation, the lower wiring 211 may have a plate shape covering at least a portion of the lower surface LS of the wiring board 210 to maximize the heat dissipation effect. In an implementation, the lower wiring 211 may have two or more plate shapes separated from each other according to embodiments.

Figure 7A:
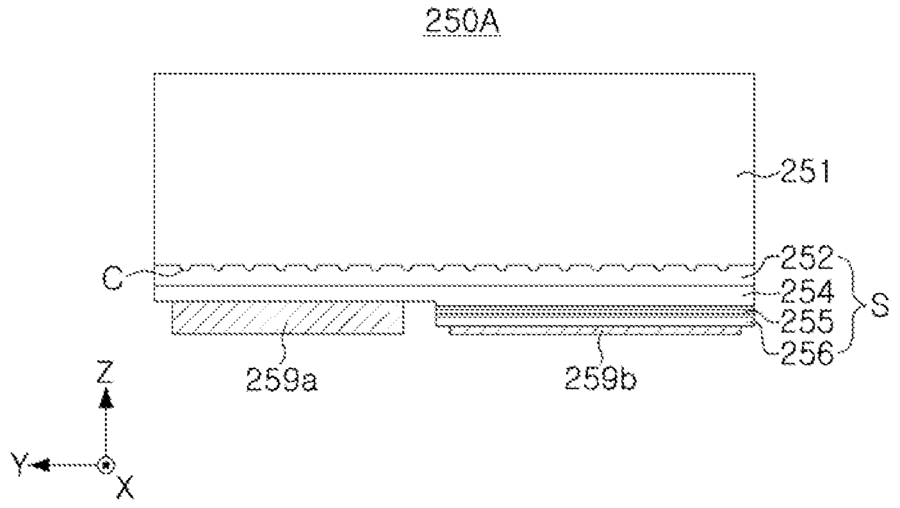
FIGS. 7A and 7B are cross-sectional views of an LED chip applicable to an LED device.
Figure 7B:
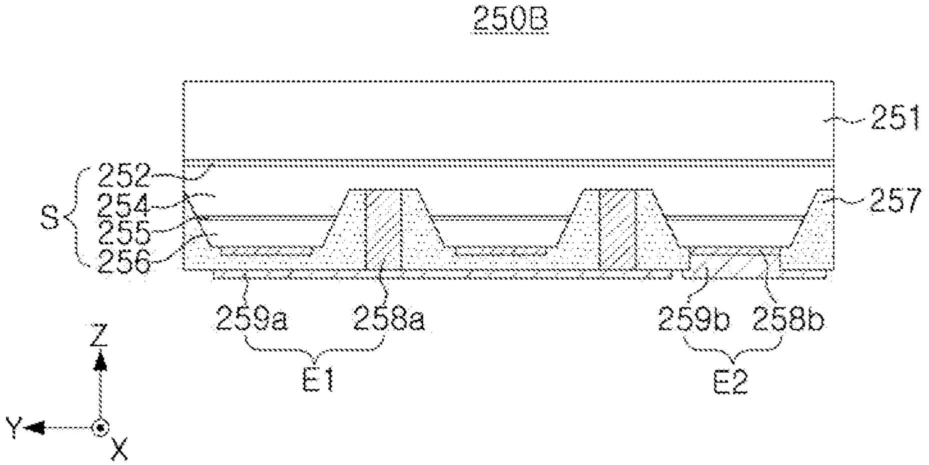

FIGS. 7A and 7B are cross-sectional views of LED chips 250A and 250B applicable to an LED device.

Referring to FIG. 7A, the LED chip 250A may include a substrate 251, and a semiconductor stack S including a first conductivity-type semiconductor layer 254, an active layer 255, and a second conductivity-type semiconductor layer 256 sequentially on the substrate 251. A buffer layer 252 may be between the substrate 251 and the first conductivity-type semiconductor layer 254.

The substrate 251 may be an insulating substrate, e.g., sapphire. In an implementation, the substrate 251 may be a conductive or semiconductor substrate in addition to an insulating substrate. In an implementation, the substrate 251 may be formed of SiC, Si, $MgAl_2O_4$, MgO, $LiAlO_2$, $LiGaO_2$, or GaN, in addition to sapphire. An uneven portion C may be formed on an upper surface of the substrate 251. The uneven portion C may help improve the quality of a grown single crystal, while improving the light extraction efficiency.

The buffer layer 252 may include $In_xAl_yGa_{1-x-y}N$ ($0\le x\le 1$, $0\le y\le 1$). In an implementation, the buffer layer 252 may include GaN, AlN, AlGaN, or InGaN. In an implementation, a plurality of layers may be combined, or some compositions may be gradually changed to be used.

The first conductivity-type semiconductor layer 254 may include a nitride semiconductor satisfying n-type $In_xAl_yGa_{1-x-y}N$ ($0\le x<1$, $0\le y<1$, $0\le x+y<1$), and an n-type impurity may be Si. In an implementation, the first conductivity-type semiconductor layer 254 may include n-type GaN. The second conductivity-type semiconductor layer 256 may include a nitride semiconductor layer satisfying p-type $In_xAl_yGa_{1-x-y}N$ ($0\le x<1$, $0\le y<1$, $0\le x+y<1$), and p-type impurity may be Mg. In an implementation, the second conductivity-type semiconductor layer 256 may be implemented as a single-layer structure, or may have a multilayer structure having different compositions.

The active layer 255 may have a multi-quantum well (MQW) structure in which quantum well layers and quantum barrier layers are alternately stacked with each other. In an implementation, the quantum well layer and the quantum barrier layer may include $In_xAl_yGa_{1-x-y}N$ ($0\le x\le 1$, $0\le y\le 1$, $0\le x+y\le 1$) having different compositions. In an implementation, the quantum well layer may include $In_xGa_{1-x}N$ ($0<x\le 1$), and the quantum barrier layer may include GaN or AlGaN. The thickness of the quantum well layer and the quantum barrier layer may be respectively in the range of, e.g., about 1 nm to about 50 nm. In an implementation, the active layer 255 may have a single quantum well structure.

The first and second electrodes 259*a* and 259*b* may be respectively on the mesa-etched region of the first conductivity-type semiconductor layer 254 and the second conductivity-type semiconductor layer 256 to be positioned on the same surface. The first electrode 259*a* may include, e.g., Ag, Ni, Al, Cr, Rh, Pd, Ir, Ru, Mg, Zn, Pt, Au, or the like, and may be employed as having a structure of a single layer or two or more layers. In an implementation, the second electrode 259*b* may be a transparent electrode such as a transparent conductive oxide or a transparent conductive nitride, or may include graphene. The second electrode 259*b* may include, e.g., Al, Au, Cr, Ni, Ti, or Sn.

Referring to FIG. 7B, an LED chip 250B may include a substrate 251 and a semiconductor stack S on the substrate 251, similarly to the previous embodiment. The semiconductor stack S may include a buffer layer 252, a first conductivity-type semiconductor layer 254, an active layer 255, and a second conductivity-type semiconductor layer 256.

The LED chip 250B may include first and second electrode structures E1 and E2 respectively connected to the first and second conductivity-type semiconductor layers 254 and 256. The first electrode structure E1 may include a connection electrode 258*a* such as a conductive via connected to the first conductivity-type semiconductor layer 254 through the second conductivity-type semiconductor layer 256 and the active layer 255 and a second electrode 259*b* connected to the connection electrode 258*a*. The connection electrode 258*a* may be surrounded by an insulating portion 257 to be electrically separated from the active layer 255 and the second conductivity-type semiconductor layer 256. The connection electrode 258*a* may be on a region in which the semiconductor stack S is etched. In an implementation, a number, shape, and pitch or the connection electrode 258*a* or a contact region thereof with the first conductivity-type semiconductor layer 254 may be appropriately designed so that contact resistance is lowered. In an implementation, the connection electrodes 258*a* may be arranged to form rows and columns on the semiconductor stack S, thereby improving current flow. The second electrode structure E2 may include an ohmic contact layer 258*b* and a second electrode 259*b* on the second conductivity-type semiconductor layer 256.

The connection electrode 258*a* and the ohmic contact layer 258*b* respectively may include a single or multilayer structure of a conductive material having ohmic characteristics with the first and second conductivity-type semiconductor layers 254 and 256 and may include, e.g., Ag, Al, Ni, Cr, a transparent conductive oxide (TCO), or the like.

The first and second electrodes 259*a* and 259*b* may be respectively connected to the connection electrode 258*a* and the ohmic contact layer 258*b*, respectively, to function as external terminals of the LED chip 250B. In an implementation, the first and second electrodes 259*a* and 259*b* may include Au, Ag, Al, Ti, W, Cu, Sn, Ni, Pt, Cr, NiSn, TiW, AuSn, or a eutectic metal thereof. The first and second electrode structures E1 and E2 may be disposed in the same direction.

FIGS. 8A to 8D are cross-sectional views of stages in a manufacturing process of an LED module according to an embodiment.

Figure 8A:
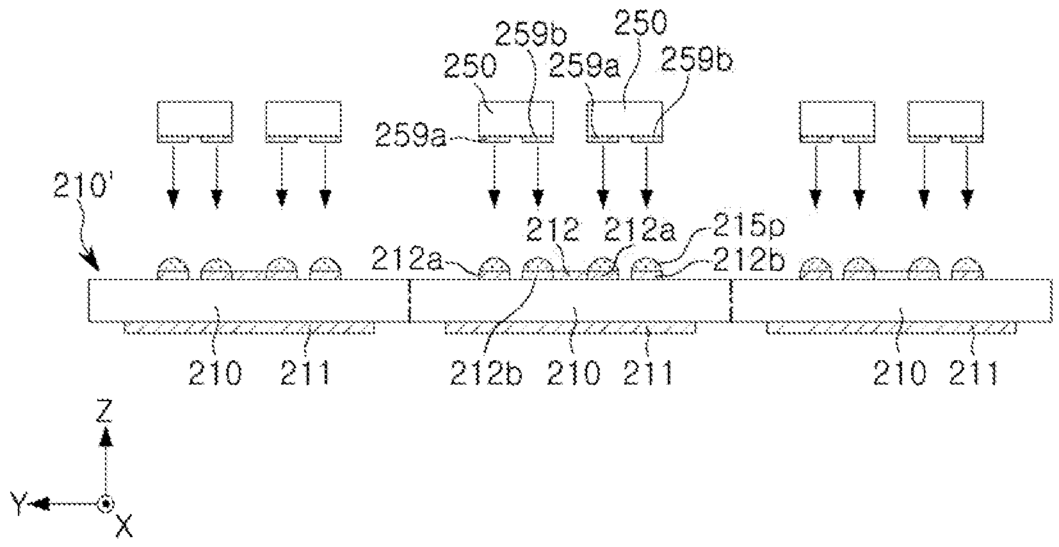
FIGS. 8A to 8D are cross-sectional views of stages in a manufacturing process of an LED module according to an embodiment.

Referring to FIG. 8A, a plurality of LED chips 250 may be surface-mounted on a strip substrate 210'. The strip substrate 210' may include a plurality of wiring boards 210. The plurality of wiring boards 210 may include a lower wiring 211 on a lower surface and an upper wiring 212 on an upper surface, respectively. The plurality of LED chips 250 may be disposed such that the first and second electrodes 259*a* and 259*b* correspond to the first and second wiring electrodes 212*a* and 212*b* of the upper wiring 212. Preliminary bumps 215*p* may be pre-attached to the first and second wiring electrodes 212*a* and 212*b* of the upper wiring 212. In an implementation, a pair of contact structures ('214' of FIG. 5A) may be mounted on the other side of the upper wiring 212.

Figure 8B:
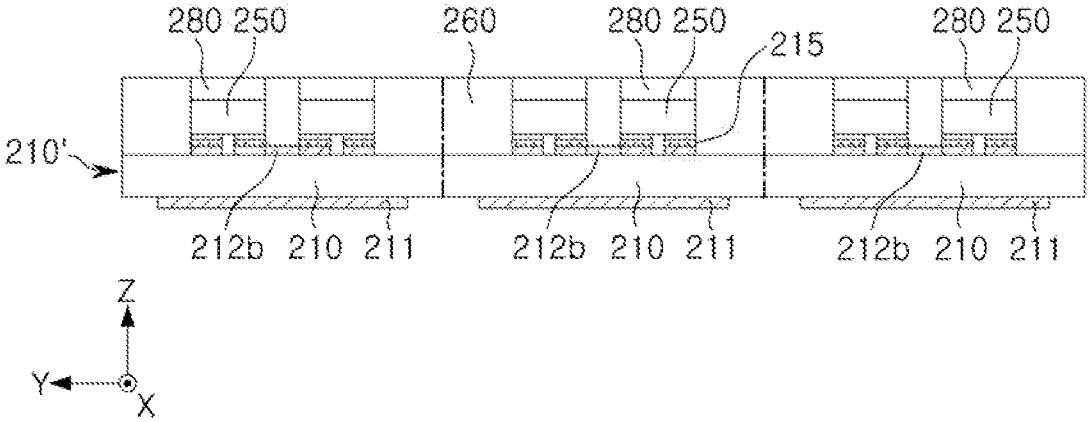

Referring to FIG. 8B, a wavelength conversion film 280 may be attached to each of the plurality of LED chips 250, and a reflective structure 260 surrounding the plurality of LED chips 250 and the wavelength conversion film 280 may be formed. The wavelength conversion film 280 may include at least one kind of wavelength conversion material. The wavelength conversion film 280 may be attached to the LED chip 250 by an adhesive member such as epoxy. The reflective structure 260 may be formed by applying and curing a resin body containing reflective powder. In an implementation, the reflective structure 260 may be formed of silicon including $TiO_2$ powder.

Figure 8C:
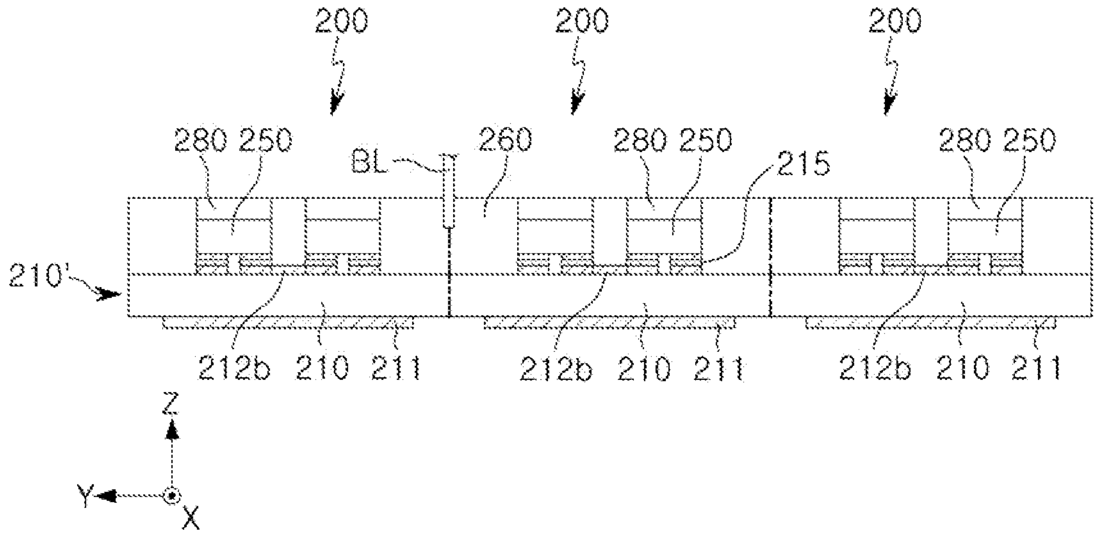

Referring to FIG. 8C, the plurality of LED devices 200 may be separated by cutting the strip substrate 210' and the reflective structure 260. The strip substrate 210' and the reflective structure 260 may be cut using a blade BL, or may also be cut by a laser according to an embodiment.

Figure 8D:
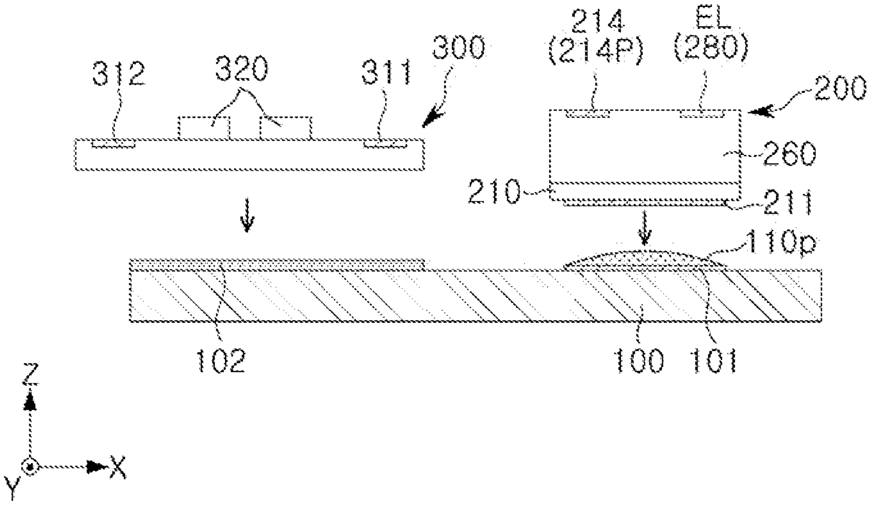

Referring to FIG. 8D, the LED device 200 and the circuit board 300 may be attached to the support 100. The LED device 200 may be attached to the heat dissipation pad 101 of the support 100. A preliminary conductive bump 110*p* may be formed on the heat dissipation pad 101. The preliminary conductive bump 110*p* may be cured by a reflow process to form the conductive bump 110 of FIG. 1B. In an implementation, the LED device 200 and the support 100 may be coupled with the heat dissipation pad 101, the lower wiring 211, and the conductive bump ('110' in FIG. 1B), thereby improving the heat dissipation and design characteristics of the LED module. The circuit board 300 may be attached to the adhesive layer 102 of the support 100 in a state in which the passive elements 320 are mounted thereon. The adhesive layer 102 may include a film or tape including an adhesive resin. Thereafter, the pair of contact pads 311 of the circuit board 300 and the pair of contact structures 214 of the LED device 200 may be connected using a bonding wire ('BW' in FIG. 1A).

Figure 9:
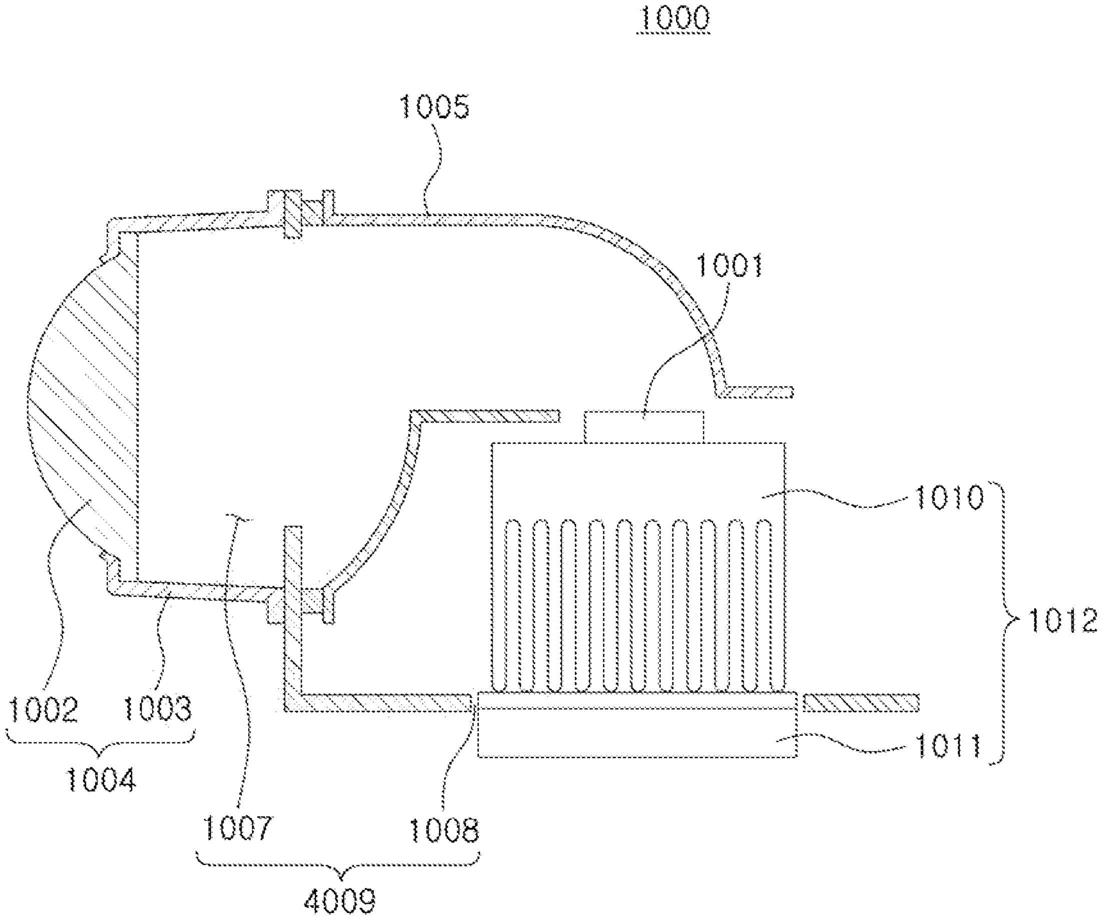
FIG. 9 is a cross-sectional view of a headlamp to which an LED module according to an embodiment is applied as a light source.

FIG. 9 is a cross-sectional view of a head lamp 1000 to which an LED module according to an embodiment is applied as a light source.

Referring to FIG. 9, the head lamp 1000 may be used as a vehicle light or the like, and may include a light source 1001, a reflector 1005, and a lens cover 1004, and the lens cover 1004 may include a hollow guide 1003 and a lens 1002. The light source 1001 may include the LED modules 10, 10*a*, 10*b*, and 10*c* described above with reference to FIGS. 1A to 7B.

The head lamp 1000 may further include a heat dissipator 1012 dissipating heat generated by the light source 1001 externally, and the heat dissipator 1012 may include a heat sink 1010 and a cooling fan 1011 to effectively dissipate heat. In addition, the head lamp 1000 may further include a housing 1009 for fixing and supporting the heat dissipator 1012 and the reflector 1005, and the housing 1009 may include a central hole 1008 in one surface of a body portion thereof to facilitate coupling and mounting of the heat dissipator 1012 therein. The housing 1009 may include a front hole 1007 for fixing the reflector 1005 to an upper side of the light source 1001 on the other surface integrally connected with the one surface and bent in a right angle direction. Accordingly, the front side may be open by the reflector 1005, and the reflector 1005 may be fixed to the housing 1009 so that the open front corresponds to the front hole 1007, and light reflected through the reflector 1005 may exit externally through the front hole 1007.

By way of summation and review, in the case of an LED module in which a plurality of LED devices are embedded, heat generated by the plurality of LED devices could cause deterioration of the performance of the LED module.

According to embodiments, an LED module having improved heat dissipation characteristics may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode (LED) module, comprising:
- a support formed of a thermally conductive material and including a heat dissipation pad protruding from the support;
- a circuit board mounted on the support and spaced apart from the heat dissipation pad, the circuit board including a pair of contact pads and a pair of electrical connection terminals electrically connected to the pair of contact pads, respectively;
- an LED device including:
  - a wiring board having a lower surface and an upper surface opposing each other,
  - a lower wiring on the lower surface of the wiring board and facing the heat dissipation pad,
  - an upper wiring on the upper surface of the wiring board and electrically insulated from the lower wiring,
  - a pair of contact structures at a first side of the upper wiring,
  - an LED chip mounted on another a second side of the upper wiring,
  - a wavelength conversion film on the at least one LED chip, and
  - a reflective structure covering the upper surface of the wiring board and exposing at least a portion of each contact structure of the at least one pair of contact structures, and exposing at least a portion of the at least one wavelength conversion film is exposed;
- bonding wires with each bonding wire electrically connecting a respective contact pad of the pair of contact pads with a respective contact structure of the pair of contact structures; and
- a conductive bump securing the lower wiring to the heat dissipation pad, the conductive bump contacting the lower wiring and the heat dissipation pad.

2. The LED module as claimed in claim 1, wherein the heat dissipation pad has a width smaller than a width of the wiring board in a direction parallel to the lower surface of the wiring board.

3. The LED module as claimed in claim 2, wherein the lower wiring has a width equal to or greater than the width of the heat dissipation pad in the direction parallel to the lower surface of the wiring board.

4. The LED module as claimed in claim 1, wherein the heat dissipation pad has a planar area smaller than a planar area of the wiring board in a plane parallel to the lower surface of the wiring board.

5. The LED module as claimed in claim 1, wherein the wiring board overlaps an entirety of the heat dissipation pad in a plan view.

6. The LED module as claimed in claim 1, wherein the conductive bump has a width equal to or less than a width of the wiring board in a direction parallel to the lower surface of the wiring board.

7. The LED module as claimed in claim 1, wherein, in a plan view, the conductive bump does not protrude beyond an edge of the wiring board.

8. The LED module as claimed in claim 1, wherein the conductive bump includes tin (Sn), indium (In), bismuth (Bi), antimony (Sb), copper (Cu), silver (Ag), zinc (Zn), lead (Pb), or an alloy thereof.

9. The LED module as claimed in claim 1, wherein a height from an upper surface of the support to an upper surface of the heat dissipation pad is 1 μm to 30 μm.

10. The LED module as claimed in claim 1, further comprising passive elements on an upper surface of the circuit board.

11. The LED module as claimed in claim 10, wherein the circuit board further includes a wiring circuit electrically connecting the passive elements to the electrical connection terminals and the pair of contact pads.

12. The LED module as claimed in claim 1, wherein the heat dissipation pad includes copper (Cu) or an alloy of copper (Cu).

13. The LED module as claimed in claim 1, wherein the support includes copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy thereof.

14. The LED module as claimed in claim 1, wherein the upper wiring and the lower wiring each include copper (Cu) or an alloy of copper (Cu).

15. The LED module as claimed in claim 1, wherein:
- the lower wiring includes a surface plating layer in contact with the conductive bump, and
- the surface plating layer includes tin (Sn), lead (Pb), nickel (Ni), or gold (Au).

16. The LED module as claimed in claim 1, wherein the lower wiring has a plate shape covering the lower surface of the wiring board.

17. The LED module as claimed in claim 1, wherein each contact structure of the pair of contact structures includes a metal pad portion exposed at an upper surface of the LED device.

18. A light emitting diode (LED) module, comprising:
- a support formed of a thermally conductive material and including a heat dissipation pad protruding from the support;
- a circuit board mounted on the support and spaced apart from the heat dissipation pad and including a pair of contact pads;
- an LED device including:
  - a wiring board having a lower surface and an upper surface opposing each other,
  - a lower wiring on the lower surface of the wiring board and facing the heat dissipation pad,
  - an upper wiring on the upper surface of the wiring board,
  - a pair of contact structures on the upper wiring, a plurality of LED chips electrically connected to the pair of contact structures through the upper wiring, and a reflective structure covering the upper surface of the wiring board and exposing at least a portion of the pair of contact structures;

bonding wires with each bonding wire electrically connecting one contact pad of the pair of contact pads with a respective contact structure of the pair of contact structures; and a conductive bump securing the lower wiring to the heat dissipation pad, the conductive bump contacting the lower wiring and the heat dissipation pad.

19. The LED module as claimed in claim 18, wherein the plurality of LED chips are connected to each other in series.

20. A light emitting diode (LED) module, comprising:

a support formed of an electrically conducting material and including a heat dissipation pad protruding from the support;

a circuit board mounted on the support and spaced apart from the heat dissipation pad and including a pair of contact pads;

an LED device including:

a wiring board having a lower surface and an upper surface opposing each other, a lower wiring on the lower surface of the wiring board and facing the heat dissipation pad, an upper wiring on the upper surface of the wiring board, a pair of contact structures on the upper wiring, a plurality of LED chips electrically connected to the pair of contact structures through the upper wiring, and a reflective structure covering the upper surface of the wiring board and exposing at least a portion of the pair of contact structures;

bonding wires with each bonding wire electrically connecting one contact pad of the pair of contact pads with a respective contact structure of the pair of contact structures; and a conductive bump adhering the lower wiring to the heat dissipation pad, wherein the heat dissipation pad completely overlaps the LED device in a plan view.

* * * * *